United States Patent
Liang et al.

(10) Patent No.: US 7,453,280 B1
(45) Date of Patent: Nov. 18, 2008

(54) METHOD FOR TESTING SEMICONDUCTOR DEVICES

(75) Inventors: Sheng-Hui Liang, Hsin-Chu (TW); Chia-Lin Chen, Jhubei (TW); Pei-Chun Liao, Jhubei (TW); Chin-Yuan Ko, Hsinchu (TW)

(73) Assignee: Taiwan Semiconductor Manufacturing Co., Ltd., Science-Based Industrial Park (TW)

( * ) Notice: Subject to any disclaimer, the term of this patent is extended or adjusted under 35 U.S.C. 154(b) by 0 days.

(21) Appl. No.: 11/896,364

(22) Filed: Aug. 31, 2007

(51) Int. Cl.
*G01R 31/26* (2006.01)
*G01R 31/28* (2006.01)

(52) U.S. Cl. .................... 324/765; 324/158.1

(58) Field of Classification Search ............ 324/765, 324/158.1, 763, 760; 438/14–18; 257/530, 257/48
See application file for complete search history.

(56) References Cited

U.S. PATENT DOCUMENTS

| 6,521,469 | B1 | 2/2003 | La Rosa et al. |
| 6,734,028 | B1 * | 5/2004 | Yang et al. ............... 438/17 |
| 6,781,401 | B2 | 8/2004 | Kim |
| 6,815,970 | B2 * | 11/2004 | Rost et al. ............... 324/765 |
| 6,967,499 | B1 * | 11/2005 | Haase et al. ............. 324/766 |

\* cited by examiner

*Primary Examiner*—Ha Tran T Nguyen
*Assistant Examiner*—Tung X Nguyen
(74) *Attorney, Agent, or Firm*—Reed Smith LLP; Stanley P. Fisher, Esq.; Juan Carlos A. Marquez, Esq.

(57) ABSTRACT

A method for testing a batch of semiconductor devices in wafer level is provided. The method includes the following steps: (a) obtaining a breakdown voltage of gate dielectric of each semiconductor device; (b) applying, to the gate dielectric of each semiconductor device, a stress voltage below the breakdown voltage but above a base voltage of gate dielectric of the semiconductor devices; (c) after the step (b), measuring currents of gate dielectric of each semiconductor devices at the base voltage; and (d) obtaining a tailing distribution from the measured currents.

15 Claims, 4 Drawing Sheets

(A)

METHOD FOR TESTING SEMICONDUCTOR DEVICES

FIELD OF INVENTION

The invention relates to a method for testing gate dielectric of semiconductor devices and, more specifically, to a method for testing the semiconductor device in the wafer level to quickly predict dielectric related product failure rate.

BACKGROUND OF THE INVENTION

The monitoring of gate oxides is a difficult but highly desirable procedure for reducing manufacturing rejects in the semiconductor industry. On one hand, accuracy is required to ensure that good chips are not wrongly rejected and defective chips are not mistakenly passed by; on the other hand, the monitoring cannot be time consuming, so as not to hold up the throughput.

In the manufacture of semiconductor devices, various layers of material are deposited on the semiconductor substrate followed by removal of unwanted portions of each layer. The procedures used to deposit the layers, such as chemical vapor deposition in sputtering conditions, as well as the procedures used to remove unwanted material, such as such as chemical, plasma, or reactive ion etching among others, may cause damage to underlying structures, particularly very thin structures, such as gate oxides.

For example, metal-oxide semiconductor (MOS) transistors rely upon a thin silicon oxide gate separating the gate from the channel. Damage to the gate oxide layer may result in unacceptable current leakage from the gate to the channel, thereby resulting in reduced device performance or even total failure.

The manufacturer would therefore desire to test and monitor the quality of the gates coming down the assembly line so as to detect faults in the manufacturing process and to remove defective chips before further processing and packaging wasted upon them.

One conventional way for testing the dielectric layer is named Time Dependent Dielectric Breakdown (TDDB), which is to estimate the characteristic and the lifetime of the dielectric layers of the chips being made of the same wafer (i.e., in the wafer level). However, TDDB requires longer testing time, and particularly needs to test multiple test structures for obtaining enough amount of testing samples.

Another conventional way for testing the dielectric layer is Ramped Voltage Breakdown Test. Typically, a ramped sweep voltage is placed across the gate oxide by connecting probes to the gate and the semiconductor substrate, just beneath the gate oxide. A typical procedure would be to ramp the voltage from a base voltage to an increasingly higher stress voltage and take two current measurements, one at the base voltage and one at the stress voltage. This procedure is repeated, increasing the stress voltage each time in some small increment until a maximum stress voltage is reached. The procedure is accurate enough, but still time consuming.

Furthermore, for semiconductor memory devices, like SRAM, one skilled in the art would appreciate that the value of the lowest operating voltage (Vccmin) may be dependent on the process used to fabricate the memory array or design of the memory. However, those TDDB test and Ramped Voltage Breakdown Test mentioned above, as well as other conventional wafer level testing, cannot reflect the shift of Vccmin, which can only be investigated at the test in the product level, e.g., Accelerated High Temperature Operation Life (AHTOL). But it will be too late and will waste a lot of resource if the test result is not satisfied.

Therefore, it is desired to have a method for quickly testing gate dielectric of semiconductor devices in wafer level. It will be beneficial if the testing method can provide a new indication of defects of the semiconductor devices. It will be more advantageous if the testing method, performed in the wafer level, can reflect the shift of Vccmin mentioned above.

SUMMARY OF THE INVENTION

One aspect of the present invention is to provide a method for quickly testing gate dielectric of semiconductor devices in wafer level, and it will be advantageous if the method can provide new indices or indications for reflecting the defects of gate dielectrics of the semiconductor devices.

Another aspect of the present invention is to provide a method for testing gate dielectric of semiconductor devices, and it will be advantageous if the method can reflect the shift of the lowest operating voltage of the semiconductor devices in the wafer level.

Still another aspect of the present invention is to provide a method for testing gate dielectric of semiconductor devices in wafer level, and it will be advantageous if the method can provide references for grading the semiconductor devices undergoing different manufacturing processes.

Yet another aspect of the present invention is to provide a method for selecting a first batch of semiconductor devices or a second batch of semiconductor devices, and it will be advantageous if the method can provide a way to select a manufacturing process that the first batch of semiconductor devices or the second batch of semiconductor devices undergo.

In one embodiment, disclosed is a method for testing a batch of semiconductor devices in wafer level. The method includes the following steps: (a) obtaining a breakdown voltage; (b) applying, to the gate dielectric of each semiconductor device, a stress voltage below the breakdown voltage but above a base voltage of gate dielectric of the semiconductor devices; (c) after the step (b), measuring currents of gate dielectric of each semiconductor devices at said base voltage; and (d) obtaining a tailing distribution from the measured currents. The present invention also discloses a program storage device readable by machine, tangibly embodying a program of instruction executable by the machine to perform a method as recited above.

In another embodiment, disclosed is a method for selecting a first batch of semiconductor devices or a second batch of semiconductor devices. The method includes the following steps: for the first batch of semiconductor devices, performing the aforementioned method to obtain a first tailing distribution; for the second batch of semiconductor devices, performing the aforementioned method to obtain a second tailing distribution; and selecting the first batch or the second batch based on the first tailing distribution and the second tailing distribution.

The foregoing and other features of the invention will be apparent from the following more particular description of embodiment of the invention.

BRIEF DESCRIPTION OF THE DRAWINGS

The present invention is illustrated by way of example and not intended to be limited by the figures of the accompanying drawing, in which like notations indicate similar elements.

DETAILED DESCRIPTION

The present invention is particularly useful for testing SRAM devices and will be described with reference to the accompanying drawings. However, those skilled in the art can understand that the present invention may, however, be embodied in many different forms and should not be construed as limited to the embodiments set forth herein.

Figure 1A:
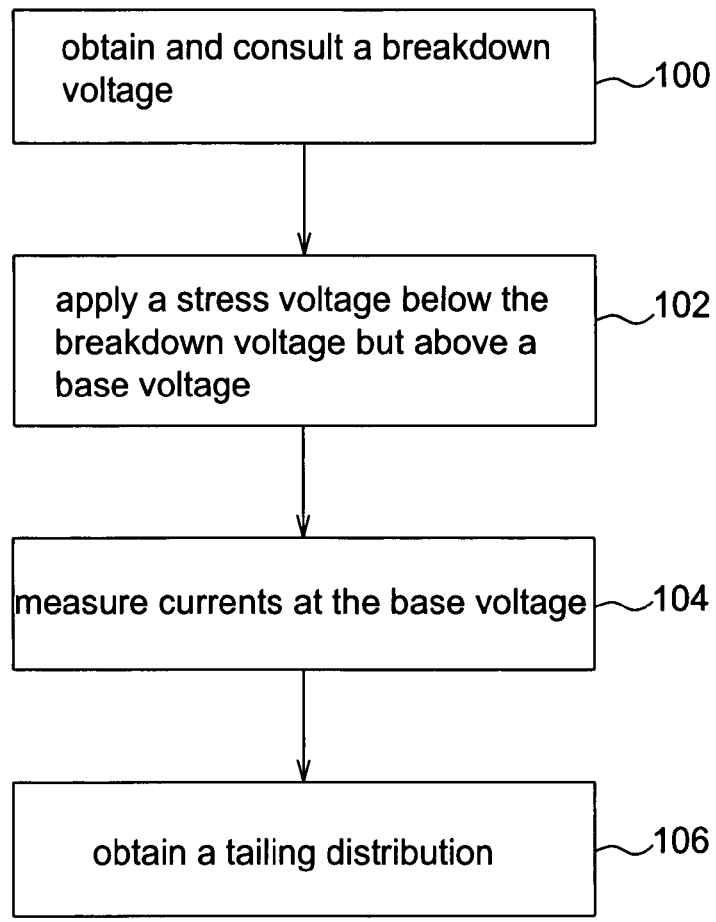
FIG. 1a illustrates a flowchart of a method for testing a batch of semiconductor devices in the wafer level according to an embodiment of the present invention.

FIG. 1a illustrates a flowchart of a method for testing a batch of semiconductor devices, e.g., SRAM cells, in the wafer level according to an embodiment of the present invention. One "batch", for example, may contain 1000, 6400, or even more SRAM cells. The present invention does not like to limit the number of devices in a batch, but few devices in a batch may make the testing results impractical.

According to the present invention, before the batch of semiconductor devices is further processed for testing, in the step 100, a breakdown voltage of gate dielectric of a "sample" semiconductor device or a group of sample semiconductor devices has to be obtained or consulted, as a reference for the subsequent procedures of the present invention.

As described in detail later, a typical breakdown voltage test would damage the tested devices, so the breakdown of the batch of devices cannot be measured directly and has to be referred to the breakdown voltage of the sample semiconductor device(s). Therefore, the sample semiconductor device(s) should have similar structures, undergo similar manufacturing processes, and thus have the similar characteristics to the batch of semiconductor devices to be tested according to the present invention.

Because the breakdown voltage in the step 100 is simply provided as a reference, it is not essential to know precisely breakdown voltage of the sample semiconductor device(s). Therefore the step 100 can be less time-consuming. In addition, the breakdown voltage in the step 100 is preferably estimated conservatively, i.e., to obtain a "least" breakdown voltage for the underlying batch of semiconductor devices. Thus in the subsequent steps, the batch of semiconductor devices would be prevented from being immediately damaged by a too high voltage. Also note that it is not necessary to perform a breakdown voltage test to obtain the breakdown voltage every time before the execution of the subsequent step 102. Step 100 can be performed once and the breakdown voltage can be saved as a reference for one or more batches of the semiconductor devices to be tested.

Figure 1B:
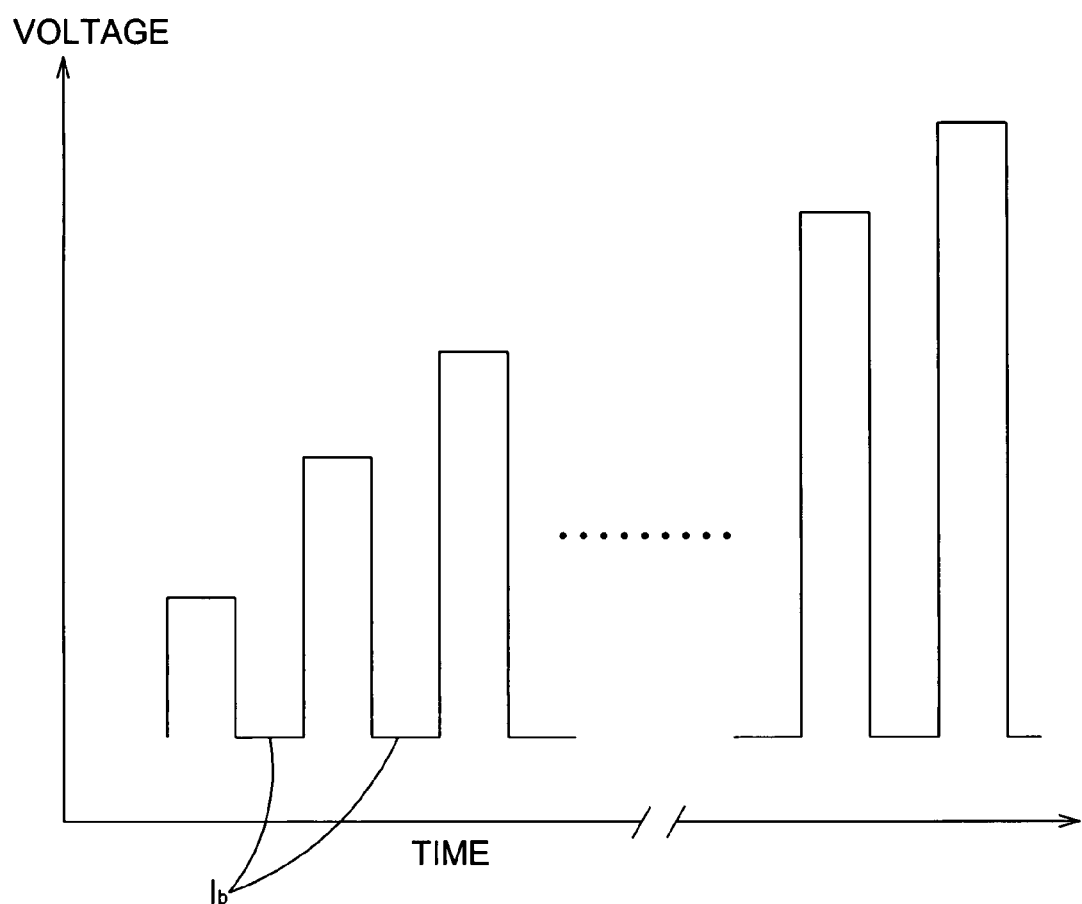
FIG. 1b shows a graph of voltage versus time for a typical ramped voltage breakdown test.

In an embodiment, the breakdown voltage of the step 100 is measured by the ramped breakdown voltage test. FIG. 1b shows a graph of voltage versus time for a typical ramped voltage breakdown test. A ramped sweep voltage is placed across a dielectric, i.e., a gate oxide, using commercially available testing devices well known in the art. The voltage is applied by connecting probes across the dielectric.

During testing, the voltage is ramped from a base voltage Vb to an increasingly higher stress voltage Vs and two current measurements are taken, a base current Ib measurement at the base voltage and a stress current measurement at the stress voltage.

The base voltage will typically be selected to be substantially equal to the operating voltage of the dielectric (e.g., about 1.1 V). This procedure is repeated, increasing the stress voltage each time by some small increments Vs, often 0.1 V, until a maximum stress voltage Vmax (e.g., 3.8 V) is reached and the stress current suddenly arises to the breakdown current. Note that the Vmax may be dependent on different manufacturing processes and on different semiconductor devices.

After the breakdown voltage is determined in the step 100, the step 102 is to apply, to the gate dielectric of the semiconductor devices, a stress voltage below the breakdown voltage obtained in the step 100 but above a base voltage (e.g., around 1.1 V-1.3 V for a typical SRAM device) of gate dielectric of said semiconductor devices. The testing devices, such as probes, used in step 100 may be also adopted in the steps 102 and 104 but with different settings. The stress voltage adopted in the step 102 can be one of the stress voltages ramped in the step 100. Preferably, the stress voltage used in the step 102 is close to the breakdown voltage obtained in the step 100, and should be higher, to an extent, than the base voltage or the expected operation voltage. For example, the stress voltage is around 3 V to 3.4 V for a typical SRAM device and may be changed for different semiconductor devices.

Then in the step 104, similar to the current measurement in the ramped breakdown voltage test in the step 100, is to measure currents, Ib, of gate dielectric of each semiconductor device at the base voltage, Vb. Ideally, the measured currents for each semiconductor device are expected to be the same. However, in practice, some semiconductor devices in that batch may be less perfect than the others. Then the high stress voltage applied in the step 102 would further damage these defective semiconductor devices. Accordingly these damaged semiconductor devices, at Vb, will result in higher Ib than the other intact ones.

Figure 1C:
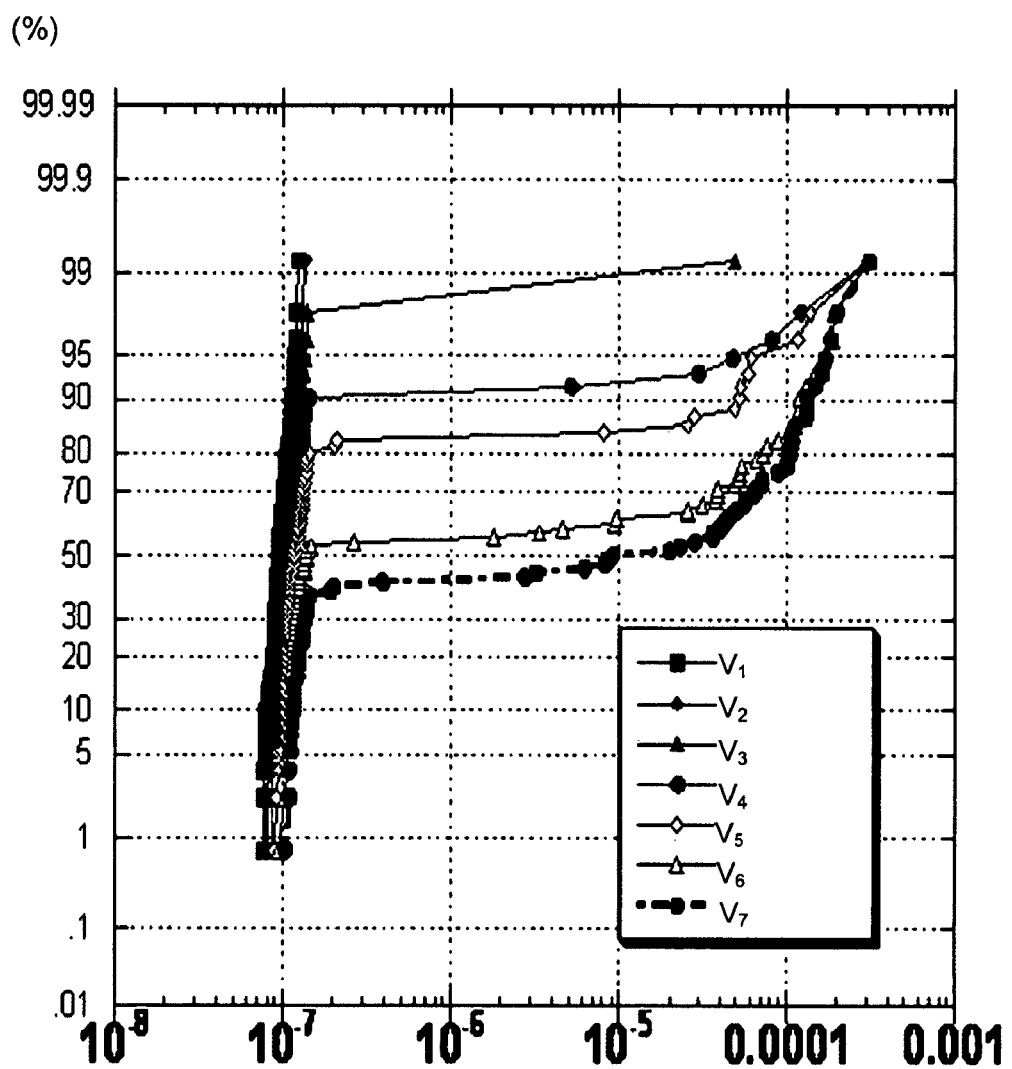
FIG. 1c shows a tailing distribution in a graph of current versus cumulative percentage of the devices.

After obtaining the currents measured in the step 104 for each semiconductor device, the step 106 is to generate a tailing distribution in a graph of current versus cumulative percentage (or cumulative number) of the devices, as shown in FIG. 1c. Those skilled in the art should understand that the tailing distribution shown in FIG. 1c is derived from the deviations of base currents measured in the step 104. Note that the relationship between currents and the semiconductor devices can be illustrated in a variety forms other than FIG. 1c, but the present invention likes to cover all of them which can be easily derived from the deviations of base currents measured in the step 104, while the distribution may not look like a "tailing" in some derived forms.

In FIG. 1c, the X-axis represents current (A), and the Y-axis represents the cumulative percentage (%) of the total semiconductor devices under the test. As shown, the devices having current around $10^{-7}$ A can be categorized as a "good" group, while the other devices' currents, higher than $10^{-7}$ A, form a raising tailing distribution and can be categorized as a "defective" group.

To better define the tailing distribution, a threshold tailing current, for example, $10^{-6}$ A or $10^{-5}$ A, can be set in FIG. 1c. Thus those devices having current higher than this threshold tailing current would compose the "tailing" and would be deemed defects. By counting the number (or the percentage) of those defective devices, a defect rate of that batch can be derived. And the batch can be further graded according to the defect rate, while less devices falling into the tailing distribution represents a better quality of that batch. Note that this threshold tailing current could be changed for different manufacturing processes and for different semiconductor devices.

Those skilled in the art should understand that, compared with the prior art, the defect rate proposed in the present invention provides a new indication of the defects of the batch of the semiconductor devices. Further, it can be found that this defect rate is well correlated to the shift of the lowest operating voltage (Vccmin) in the Accelerated High Temperature Operation Life (ATHOL) test, which is conventionally performed in the product level. Therefore, the defect rate of the present invention, derived from the tailing distribution, can provide an early indication to reflect the Vccmin shift in the wafer level.

FIG. 1c further shows the test results of seven different stress voltages ($V_1$ to $V_7$, from low to high) applied in the step 102. As shown, a higher stress voltage makes more devices falling into the tailing distribution because a small intrinsic defect would be exaggerated by the high stress voltage. Therefore, the stress voltage in the step 102 has to be modestly high, while a low stress voltage, like $V_1$, may not reveal those defects. In another embodiment, the steps 102 to 106 will be repeated with stress voltages ramped from the base voltage until the obtained tailing distribution is significant enough. However, note that a too high stress voltage is neither favored because it may damage most of the semiconductor devices.

Figure 2:
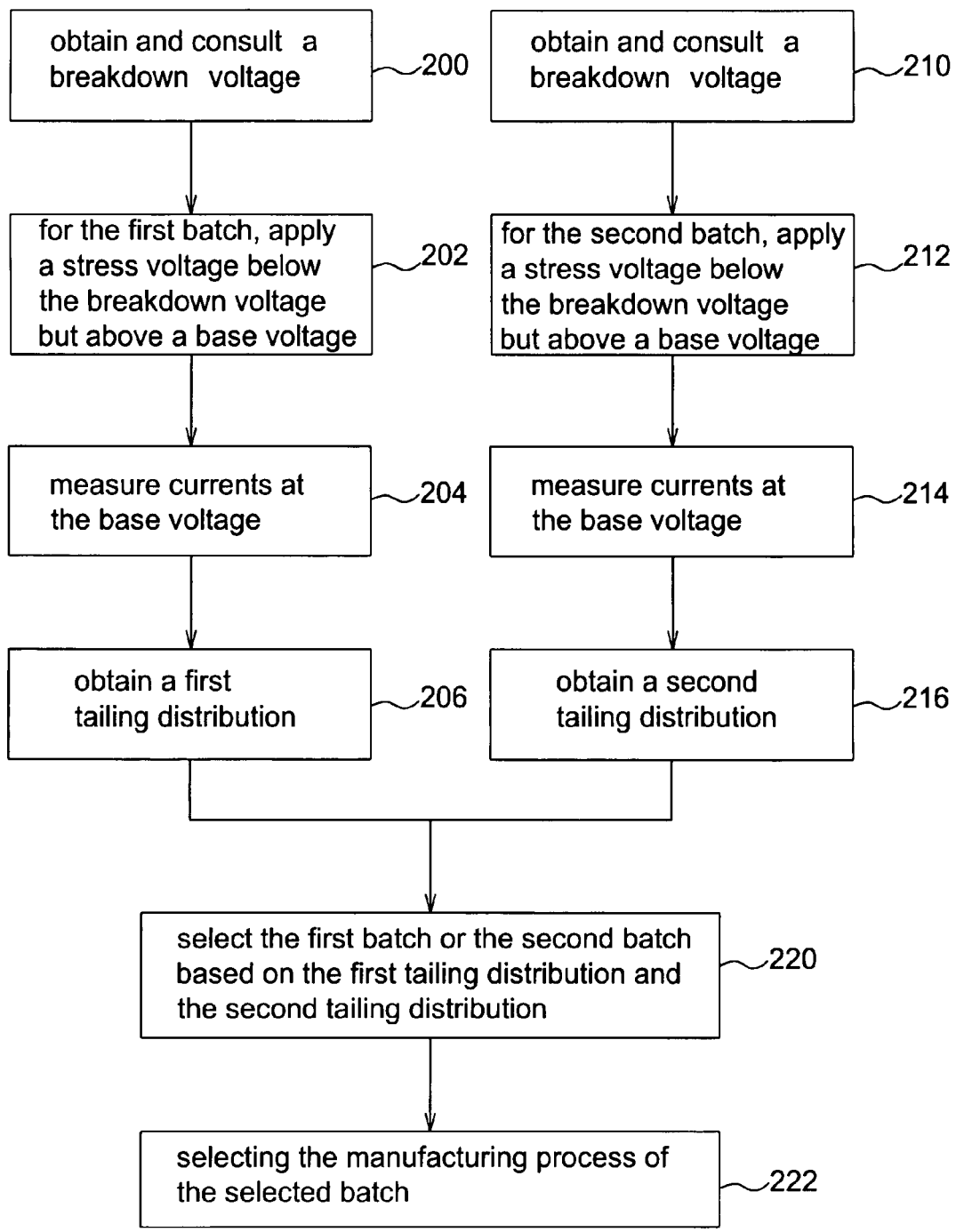
FIG. 2 illustrates a flowchart of a method for selecting a first batch of semiconductor devices or a second batch of semiconductor devices in wafer level according to an embodiment of the present invention.

FIG. 2 illustrates a flowchart of a method for selecting a first batch of semiconductor devices or a second batch of semiconductor devices in wafer level according to an embodiment of the present invention.

As stated above, the semiconductor manufacturer would desire to test and monitor the quality of the gates to detect faults in the manufacturing process. It is even desirable when the manufacturer introduces a new manufacturing process and wants to optimize processing conditions thereof. The method shown in FIG. 2 is particularly useful in these situations, where different processing conditions apparently result in different tailing distributions, and thus a preferred condition can be selected therefrom.

The steps shown in FIG. 2 are only directed to two batches of semiconductor devices, but those skilled in the art should know how to apply the illustrated steps to more than two batches of semiconductor devices.

The steps 200 to 206, which are similar to the steps 100 to 106, are performed for the first batch of semiconductor devices to obtain a first tailing distribution. In the step 200, a breakdown voltage is obtained or consulted. Then the step 202 is to apply, to the gate dielectric of each semiconductor device, a stress voltage below the breakdown voltage but above a base voltage of gate dielectric of the semiconductor devices. Next, the step 204 is to measure currents of gate dielectric of each semiconductor devices at the base voltage. In the step 206, a first tailing distribution from the measured currents is obtained. In parallel, the steps 210 to 216, which are also similar to the steps 100 to 106, are performed for the second batch of semiconductor devices to obtain a second tailing distribution.

To eliminate other potential variations, preferably, the number of semiconductor devices contained in each batch are set to be the same. Also the stress voltage applied in the step 202 and step 212 are set to be the same, but the stress voltage should not higher than the breakdown voltages in both step 200 and the step 210. For example, the stress voltage is around 3 V to 3.4 V for typical SRAM devices and may be changed for different semiconductor devices and for different manufacturing processes.

For example, the first batch of semiconductor devices and the second batch of semiconductor devices are SRAM cells. The first batch of SRAM cells undergo a first manufacturing process, and the second batch of SRAM cells undergo a second manufacturing process. The first manufacturing process and the second manufacturing process are intended to be different in one or more processing condition, e.g., the processing temperature, the concentration of chemical, the processing time, etc. One of the first batch and the second batch is expected to have more defects than the other. And by comparing the first tailing distribution with the second tailing distribution or the defect rates derived from them, a better batch of semiconductor devices can be selected in the step 220, and then, the manufacturing process for that better batch can be adopted in the step 222.

The present invention also discloses a program storage device readable by machine, tangibly embodying a program of instruction executable by the machine to perform the methods illustrated in FIG. 1a and FIG. 2. Any suitable computer-readable storage medium may be utilized to store the program, including hard disks, CD-ROM, optical storage devices, magnetic storage devices, and/or the like.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A method for testing a batch of semiconductor devices in wafer level, comprising:
   (a) obtaining a breakdown voltage;
   (b) applying, to the gate dielectric of semiconductor devices, a stress voltage below said breakdown voltage but above a base voltage of gate dielectric of said semiconductor devices;
   (c) after the step (b), measuring currents of gate dielectric of each semiconductor devices at said base voltage; and
   (d) obtaining a tailing distribution from said measured currents.

2. A method according to claim 1, further comprising: (e) counting the number of said semiconductor devices whose currents result in said tailing distribution.

3. A method according to claim 1, further comprising: (f) deriving a defect rate of said batch of semiconductor devices from said tailing distribution.

4. A method according to claim 1, further comprising: (g) grading said batch of semiconductor devices according to said tailing distribution.

5. A method according to claim 1, wherein said batch of semiconductor devices are SRAM cells.

6. A method according to claim 1, wherein said stress voltage is around 3 V to 3.4 V.

7. A program storage device readable by machine, tangibly embodying a program of instruction executable by the machine to perform a method for testing a batch of semiconductor devices in wafer level, said method comprising:
   (a) obtaining a breakdown voltage;
   (b) applying, to the gate dielectric of semiconductor devices, a stress voltage below said breakdown voltage but above a base voltage of gate dielectric of said semiconductor devices;
   (c) after the step (b), measuring currents of gate dielectric of each semiconductor devices at said base voltage; and (d) obtaining a tailing distribution from said measured currents.

8. A program storage device according to claim 7, wherein said method further comprises: (e) counting the number of said semiconductor devices whose currents result in said tailing distribution.

9. A program storage device according to claim 7, wherein said method further comprises: (f) deriving a defect rate of said batch of semiconductor devices from said tailing distribution.

10. A program storage device according to claim 7, wherein said method further comprises: (g) grading said batch of semiconductor devices according to said tailing distribution.

11. A method for selecting a first batch of semiconductor devices or a second batch of semiconductor devices, comprising:

for said first batch of semiconductor devices, performing a method as recited in claim 1 to obtain a first tailing distribution;

for said second batch of semiconductor devices, performing a method as recited in claim 1 to obtain a second tailing distribution; and selecting said first batch or said second batch based on said first tailing distribution and said second tailing distribution.

12. A method according to claim 11, wherein said first batch of semiconductor devices and said second batch of semiconductor devices are SRAM cells.

13. A method according to claim 11, wherein said stress voltage is around 3 V to 3.4 V.

14. A method according to claim 11, wherein said first batch of semiconductor devices undergoes a first manufacturing process, and said second batch of semiconductor devices undergoes a second manufacturing process different from said first manufacturing process.

15. A method according to claim 14, further comprising: selecting said first manufacturing process or said second manufacturing process based on said first tailing distribution and said second tailing distribution.

* * * * *